(12) United States Patent
Tsubata et al.

(10) Patent No.: US 10,388,855 B2
(45) Date of Patent: Aug. 20, 2019

(54) MAGNETIC MEMORY DEVICE

(71) Applicant: TOSHIBA MEMORY CORPORATION, Minato-ku, Tokyo (JP)

(72) Inventors: Shuichi Tsubata, Seoul (KR); Masatoshi Yoshikawa, Seoul (KR); Kenji Noma, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 8 days.

(21) Appl. No.: 15/691,446

(22) Filed: Aug. 30, 2017

(65) Prior Publication Data

US 2018/0269386 A1    Sep. 20, 2018

Related U.S. Application Data

(60) Provisional application No. 62/473,030, filed on Mar. 17, 2017.

(51) Int. Cl.
 *G11C 11/16* (2006.01)
 *H01L 27/22* (2006.01)
 (Continued)

(52) U.S. Cl.
 CPC ............ *H01L 43/08* (2013.01); *G11C 11/161* (2013.01); *H01L 43/02* (2013.01); *H01L 27/228* (2013.01); *H01L 43/12* (2013.01)

(58) Field of Classification Search
 CPC ........... G11C 2211/5615; G11C 11/161; H01L 43/08; H01L 27/226–27/228; H01L 43/12; H01L 43/02
 See application file for complete search history.

(56) References Cited

U.S. PATENT DOCUMENTS 7,889,543 B2   2/2011  Morise et al.
8,040,641 B2  10/2011  Miyauchi et al.
(Continued)

FOREIGN PATENT DOCUMENTS

JP    2007329157 A   12/2007
JP    2013012546 A    1/2013
(Continued)

OTHER PUBLICATIONS

U.S. Appl. No. 15/261,703, Title: "Magnetoresistive Element and Method of Manufacturing the Same," filed Sep. 9, 2016, First Named Inventor: Masatoshi Yoshikawa.

*Primary Examiner* — Farun Lu
(74) *Attorney, Agent, or Firm* — Holtz, Holtz & Volek PC

(57) ABSTRACT

According to one embodiment, a magnetic memory device includes a stacked structure including a first magnetic layer having a variable magnetization direction, a nonmagnetic layer provided on the first magnetic layer, and a second magnetic layer provided on the nonmagnetic layer and having a fixed magnetization direction, wherein as viewed in a direction parallel to a stacked direction of the stacked structure, a pattern of a lower surface of the first magnetic layer is located inside a pattern of an upper surface of the first magnetic layer, and a pattern of an upper surface of the second magnetic layer is located inside a pattern of a lower surface of the second magnetic layer or substantially conforms to the pattern of the lower surface of the second magnetic layer.

17 Claims, 7 Drawing Sheets

(51) Int. Cl.
*H01L 43/02* (2006.01)
*H01L 43/08* (2006.01)
*H01L 43/12* (2006.01)

(56) References Cited

U.S. PATENT DOCUMENTS

| | | | |
|---|---|---|---|
| 8,531,875 B2 | 9/2013 | Yanagi et al. | |
| 8,710,605 B2 | 4/2014 | Takahashi et al. | |
| 8,981,507 B2 | 3/2015 | Takahashi et al. | |
| 9,276,195 B2 * | 3/2016 | Kanaya | H01L 43/02 |
| 2004/0217403 A1 * | 11/2004 | Drewes | B82Y 25/00 |
| | | | 257/298 |
| 2009/0098412 A1 * | 4/2009 | Ohsawa | G11C 11/1675 |
| | | | 428/812 |
| 2016/0155934 A1 * | 6/2016 | Hwang | H01L 43/12 |
| | | | 257/421 |
| 2018/0040670 A1 * | 2/2018 | Glova | H01L 27/2436 |

FOREIGN PATENT DOCUMENTS

| | | |
|---|---|---|
| JP | 5214691 B2 | 6/2013 |
| JP | 5455313 B2 | 3/2014 |
| JP | 5542831 B2 | 7/2014 |

* cited by examiner

MAGNETIC MEMORY DEVICE

CROSS-REFERENCE TO RELATED APPLICATIONS

This application claims the benefit of U.S. Provisional Application No. 62/473,030, field Mar. 17, 2017, the entire contents of which are incorporated herein by reference.

FIELD

Embodiments described herein relate generally to a magnetic memory device.

BACKGROUND

A magnetic memory device (a semiconductor integrated circuit device) in which a magnetoresistive element and a MOS transistor are provided on the same semiconductor substrate has been proposed. The magnetoresistive element comprises a storage layer having a variable magnetization direction, a tunnel barrier layer provided on the storage layer, a reference layer provided on the tunnel barrier layer and having a fixed magnetization direction. The magnetoresistive element can store binary data based on the relationship between the magnetization direction of the storage layer and the magnetization direction of the reference layer.

In the magnetoresistive element described above, it is important to suppress a stray magnetic field applied from the reference layer to the storage layer in order to realize good write characteristics free of write errors. Accordingly, a magnetic memory device capable of suppressing a stray magnetic field is desired.

DETAILED DESCRIPTION

In general, according to one embodiment, a magnetic memory device includes a stacked structure including a first magnetic layer having a variable magnetization direction, a nonmagnetic layer provided on the first magnetic layer, and a second magnetic layer provided on the nonmagnetic layer and having a fixed magnetization direction, wherein as viewed in a direction parallel to a stacked direction of the stacked structure, a pattern of a lower surface of the first magnetic layer is located inside a pattern of an upper surface of the first magnetic layer, and a pattern of an upper surface of the second magnetic layer is located inside a pattern of a lower surface of the second magnetic layer or substantially conforms to the pattern of the lower surface of the second magnetic layer.

Embodiments will be described hereinafter with reference to the accompanying drawings.

Figure 1:
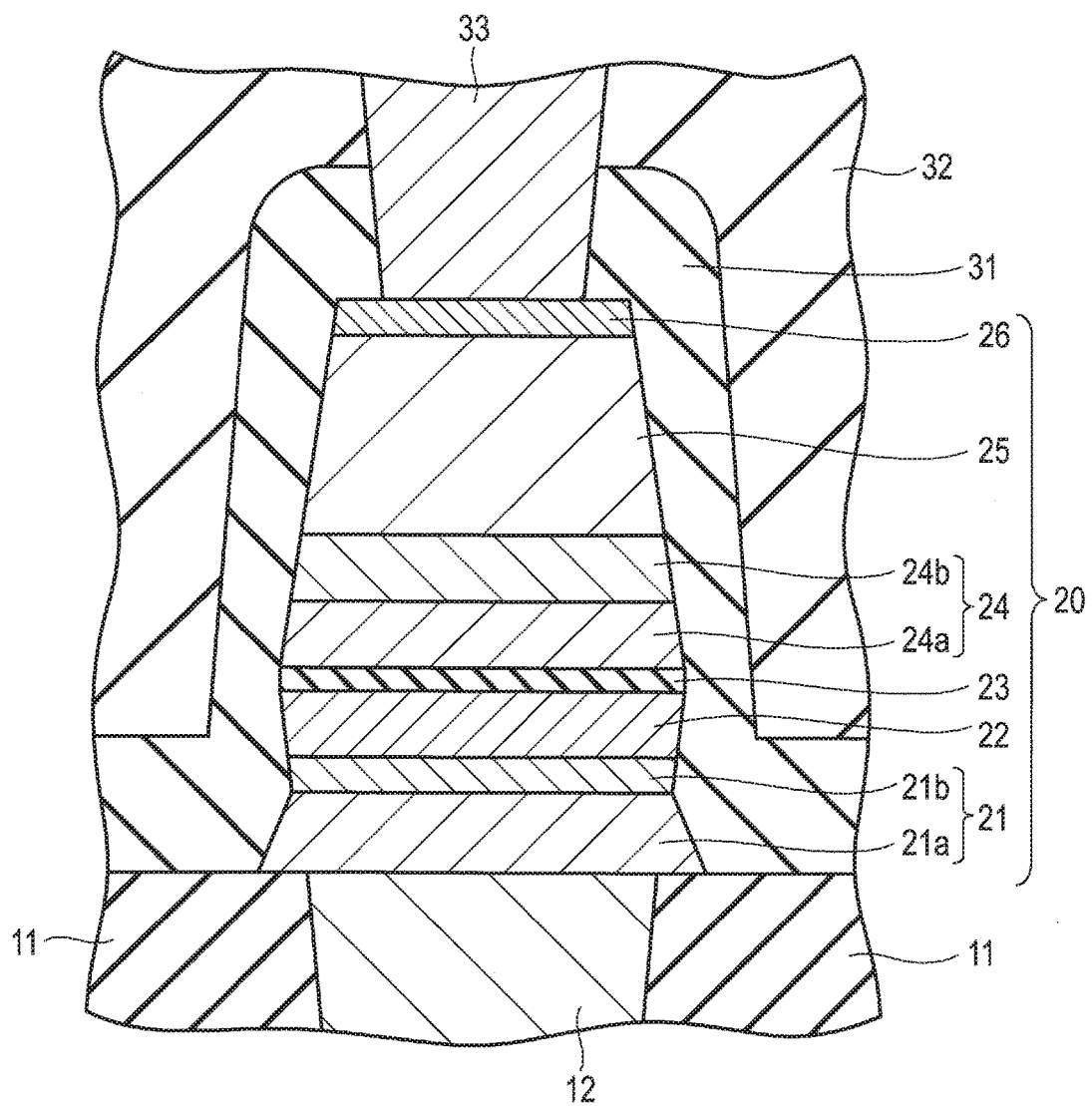
FIG. 1 is a cross-sectional view which schematically shows the structure of a magnetic memory device according to the present embodiment.

FIG. 1 is a cross-sectional view which schematically shows the structure of a magnetic memory device (a semiconductor integrated circuit device) according to an embodiment. In the magnetic memory device according to the present embodiment, a magnetoresistive element and a MOS transistor are provided on the same semiconductor substrate. Note that the magnetoresistive element is also called a magnetic tunnel junction (MTJ) element.

As shown in FIG. 1, an interlayer insulating film 11 and a bottom electrode 12 of the magnetoresistive element are provided on a bottom structure including the semiconductor substrate (not shown), the MOS transistor (not shown), and the like.

On the structure including the interlayer insulating film 11 and the bottom electrode 12, a stacked structure 20 for the magnetoresistive element is provided.

The stacked structure 20 includes a lower conductive layer 21, a storage layer (a first magnetic layer) 22 provided on the lower conductive layer 21, a tunnel barrier layer (a nonmagnetic layer) 23 provided on the storage layer 22, a reference layer (a second magnetic layer) 24 provided on the tunnel barrier layer 23, a shift canceling layer (a third magnetic layer) 25 provided on the reference layer 24, and an upper conductive layer 26 provided on the shift canceling layer 25.

The lower conductive layer 21 includes a buffer layer 21a provided on the bottom electrode 12, and an under layer 21b provided on the buffer layer 21a.

The storage layer (the first magnetic layer) 22 has a variable magnetization direction. The storage layer 22 contains iron (Fe) and boron (B). The storage layer 22 may further contain cobalt (Co) in addition to iron (Fe) and boron (B). More specifically, the storage layer 22 is formed of CoFeB.

The tunnel barrier layer (the nonmagnetic layer) 23 is an insulating layer, and contains magnesium (Mg) and oxygen (O). More specifically, the tunnel barrier layer 23 is formed of MgO.

The reference layer (the second magnetic layer) 24 has a fixed magnetization direction. The reference layer 24 includes a lower layer portion 24a provided on the tunnel barrier layer 23, and an upper layer portion 24b provided on the lower layer portion 24a. The lower layer portion 24a contains iron (Fe) and boron (B). The lower layer portion 24a may further contain cobalt (Co) in addition to iron (Fe) and boron (B). More specifically, the lower layer portion 24a is formed of CoFeB. The upper layer portion 24b contains cobalt (Co), and at least one element selected from platinum (Pt), nickel (Ni), and palladium (Pd). More specifically, the upper layer portion 24b is formed of CoPt, CoNi, or CoPd. Note that an intermediate layer formed of tantalum (Ta), etc., may be provided between the lower layer portion 24a and the upper layer portion 24b.

The shift canceling layer (the third magnetic layer) 25 has a fixed magnetization direction which is antiparallel to the magnetization direction of the reference layer 24. A magnetic field applied from the reference layer 24 to the storage layer 22 can be canceled by a magnetic field applied from the shift canceling layer 25 to the storage layer 22. The shift canceling layer 25 contains cobalt (Co), and at least one element selected from platinum (Pt), nickel (Ni), and palladium (Pd). More specifically, the shift canceling layer 25 is formed of CoPt, CoNi, or CoPd. Note that an intermediate layer formed of ruthenium (Ru), etc., may be provided between the reference layer 24 and the shift canceling layer 25.

The upper conductive layer 26 is a hard mask layer. In other words, the upper conductive layer 26 is used as a hard mask (an etching mask) in forming patterns of the lower conductive layer 21, the storage layer 22, the tunnel barrier layer 23, the reference layer 24, and the shift canceling layer 25. For the upper conductive layer 26, tungsten (W), tantalum (Ta), or the like, is used.

The stacked structure 20 described above is covered with a protective insulating film 31. A silicon nitride film, etc., is used for the protective insulating film 31. An interlayer insulating film 32 is provided on the protective insulating film 31. A top electrode 33 of the magnetoresistive element is provided in a hole formed in the protective insulating film 31 and the interlayer insulating film 32.

The resistance of the stacked structure 20 for the magnetoresistive element described above is lower in a case where the magnetization direction of the storage layer 22 is parallel to the magnetization direction of the reference layer 24 than in a case where the magnetization direction of the storage layer 22 is antiparallel to the magnetization direction of the reference layer 24. That is, when the magnetization direction of the storage layer 22 is parallel to the magnetization direction of the reference layer 24, the stacked structure 20 exhibits a low-resistance state, and when the magnetization direction of the storage layer 22 is antiparallel to the magnetization direction of the reference layer 24, the stacked structure 20 exhibits a high-resistance state. Accordingly, the magnetoresistive element can store binary data (0 or 1) in accordance with the resistance state (the low-resistance state or the high-resistance state). Also, the resistance state (the low- or the high-resistance state) of the magnetoresistive element can be set in accordance with the direction of a write current which flows through the magnetoresistive element (the stacked structure 20).

Figure 2:
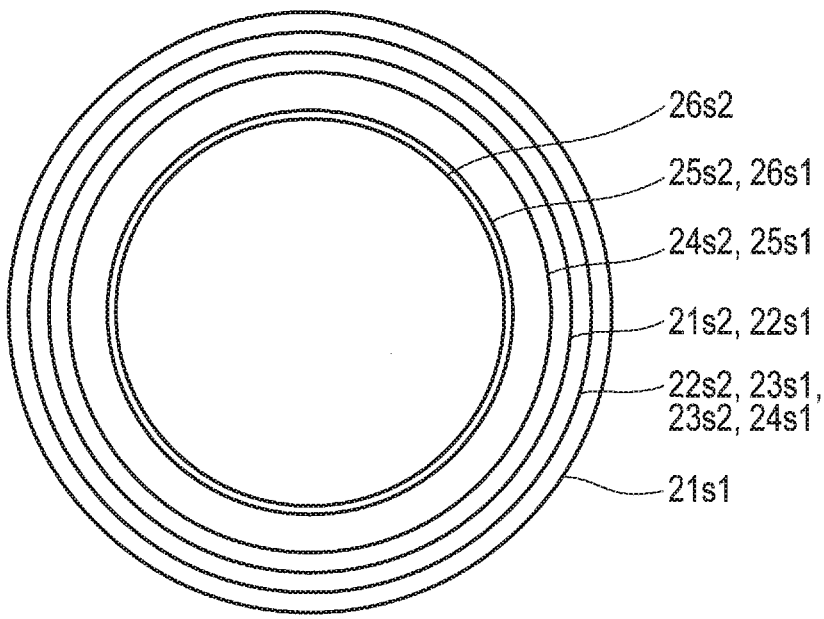
FIG. 2 is a plan view which schematically shows the structure of a stacked structure shown in FIG. 1.

FIG. 2 is a plan view which schematically shows the structure of the stacked structure 20 shown in FIG. 1.

As shown in FIG. 2, a pattern of each layer which constitutes the stacked structure 20 is circular, as viewed in a direction parallel to a stacked direction, i.e., the direction in which the layers are stacked, of the stacked structure 20. More specifically, as viewed in the direction parallel to the direction in which the layers are stacked of the stacked structure 20, a pattern of each of a lower surface 21s1 and an upper surface 21s2 of the lower conductive layer 21, a pattern of each of a lower surface 22s1 and an upper surface 22s2 of the storage layer (the first magnetic layer) 22, a pattern of each of a lower surface 23s1 and an upper surface 23s2 of the tunnel barrier layer (the non magnetic layer) 23, a pattern of each of a lower surface 24s1 and an upper surface 24s2 of the reference layer (the second magnetic layer) 24, a pattern of each of a lower surface 25s1 and an upper surface 25s2 of the shift canceling layer (the third magnetic layer) 25, and a pattern of each of a lower surface 26s1 and an upper surface 26s2 of the upper conductive layer 26 are circular.

As shown in FIGS. 1 and 2, as viewed in the direction parallel to the direction in which the layers are stacked of the stacked structure 20, the pattern of the lower surface 22s1 of the storage layer (the first magnetic layer) 22 is located inside the pattern of the upper surface 22s2 of the storage layer (the first magnetic layer) 22. In the example illustrated in FIGS. 1 and 2, a side surface of the storage layer 22 is inclined (i.e., tapered). An angle formed between the side surface of the storage layer 22 and the lower surface 22s1 of the storage layer 22 is greater than 90 degrees, and an angle formed between the side surface of the storage layer 22 and the upper surface 22s2 of the storage layer is smaller than 90 degrees.

Further, as viewed in the direction parallel to the direction in which the layers are stacked of the stacked structure 20, the pattern of the upper surface 24s2 of the reference layer (the second magnetic layer) 24 is located inside the pattern of the lower surface 24s1 of the reference layer (the second magnetic layer) 24. In the example illustrated in FIGS. 1 and 2, a side surface of the reference layer 24 is inclined (i.e., tapered). An angle formed between the side surface of the reference layer 24 and the lower surface 24s1 of the reference layer 24 is smaller than 90 degrees, and an angle formed between the side surface of the reference layer 24 and the upper surface 24s2 of the reference layer 24 is greater than 90 degrees.

Furthermore, as viewed in the direction parallel to the direction in which the layers are stacked of the stacked structure 20, the pattern of the upper surface 25s2 of the shift canceling layer (the third magnetic layer) 25 is located inside the pattern of the lower surface 25s1 of the shift canceling layer (the third magnetic layer) 25. In the example illustrated in FIGS. 1 and 2, a side surface of the shift canceling layer 25 is inclined (i.e., tapered). An angle formed between the side surface of the shift canceling layer 25 and the lower surface 25s1 of the shift canceling layer 25 is smaller than 90 degrees, and an angle formed between the side surface of the shift canceling layer 25 and the upper surface 25s2 of the shift canceling layer 25 is greater than 90 degrees.

Further, as viewed in the direction parallel to the direction in which the layers are stacked of the stacked structure 20, the pattern of the upper surface 26s2 of the upper conductive layer 26 is located inside the pattern of the lower surface 26s1 of the upper conductive layer 26. In the example illustrated in FIGS. 1 and 2, a side surface of the upper conductive layer 26 is inclined (i.e., tapered). An angle formed between the side surface of the upper conductive layer 26 and the lower surface 26s1 of the upper conductive layer 26 is smaller than 90 degrees, and an angle formed between the side surface of the upper conductive layer 26 and the upper surface 26s2 of the upper conductive layer 26 is greater than 90 degrees.

Furthermore, in the example illustrated in FIGS. 1 and 2, as viewed in the direction parallel to the direction in which the layers are stacked of the stacked structure 20, a pattern of an upper surface of the buffer layer 21a of the lower conductive layer 21 is located inside a pattern of a lower surface of the buffer layer 21a, and a pattern of a lower surface of the under layer 21b of the lower conductive layer 21 is located inside a pattern of an upper surface of the under layer 21b. More specifically, a side surface of the buffer layer 21a is inclined (i.e., tapered). An angle formed between the side surface of the buffer layer 21a and the lower surface of the buffer layer 21a is smaller than 90 degrees, and an angle formed between the side surface of the buffer layer 21a and the upper surface of the buffer layer 21a is greater than 90 degrees. In addition, a side surface of the under layer 21b is inclined (i.e., tapered). An angle formed between the side surface of the under layer 21b and the lower surface of the under layer 21b is greater than 90 degrees, and an angle formed between the side surface of the under layer 21b and the upper surface of the under layer 21b is smaller than 90 degrees. Accordingly, an angle formed between the side surface of the lower conductive layer 21 and the lower surface of the lower conductive layer 21 is smaller than 90 degrees. Also, an angle formed between the side surface of the lower conductive layer 21 and the upper surface of the lower conductive layer 21 is smaller than 90 degrees.

As shown in FIGS. 1 and 2, as viewed in the direction parallel to the direction in which the layers are stacked of the stacked structure 20, the pattern of the upper surface 22s2 of the storage layer 22 substantially conforms to the pattern of the lower surface 23s1 of the tunnel barrier layer 23, and the pattern of the lower surface 24s1 of the reference layer 24 substantially conforms to the pattern of the upper surface 23s2 of the tunnel barrier layer 23. Further, as viewed in the direction parallel to the direction in which the layers are stacked of the stacked structure 20, the pattern of the upper surface 24s2 of the reference layer 24 substantially conforms to the pattern of the lower surface 25s1 of the shift canceling layer 25. Furthermore, as viewed in the direction parallel to the direction in which the layers are stacked of the stacked structure 20, the pattern of the upper surface 25s2 of the shift canceling layer 25 substantially conforms to the pattern of the lower surface 26s1 of the upper conductive layer 26. Furthermore, as viewed in the direction parallel to the direction in which the layers are stacked of the stacked structure 20, the pattern of the lower surface 22s1 of the storage layer 22 substantially conforms to the pattern of the upper surface 21s2 of the lower conductive layer 21.

As described above, according to the present embodiment, as viewed in the direction parallel to the direction in which the layers are stacked of the stacked structure 20, the pattern of the lower surface 22s1 of the storage layer 22 is located inside the pattern of the upper surface 22s2 of the storage layer 22, and the pattern of the upper surface 24s2 of the reference layer 24 is located inside the pattern of the lower surface 24s1 of the reference layer 24. Because of this structure, of a stray magnetic field which is applied from the reference layer 24 to the storage layer 22, a stray magnetic field which remains at an end portion of the storage layer 22 as a result of insufficiency of shift cancellation can be suppressed. As a result, a magnetic memory device capable of suppressing a write error and having good write characteristics can be obtained. Additional explanation will be provided below.

When patterns of a stacked structure of a magnetoresistive element is formed by ion beam etching (IBE), etc., normally, a stacked structure of a forward taper shape whose cross-sectional size is reduced from the lower surface of the stacked structure toward the upper surface of the same is obtained. In this case, a cross-sectional size of the pattern of the storage layer located on a lower layer side becomes greater than that of the pattern of the reference layer located on an upper layer side. Also, a cross-sectional size of the pattern of the reference layer located on a lower layer side becomes greater than that of the pattern of the shift canceling layer located on an upper layer side. Accordingly, the stray magnetic field produced from a vicinity of an edge (i.e., the vicinity of the side surface) of the reference layer strongly affects a region near an edge (near the side surface) of the storage layer. In the present embodiment, since the pattern of the lower surface 22s1 of the storage layer 22 is located inside the pattern of the upper surface 22s2 of the storage layer 22, a cross-sectional size of the storage layer 22 is reduced as a whole. As a result, in the present embodiment, it is possible to reduce the influence of the stray magnetic field applied from the vicinity of the edge of the reference layer 24 to the region near the edge of the storage layer 22.

Figure 3:
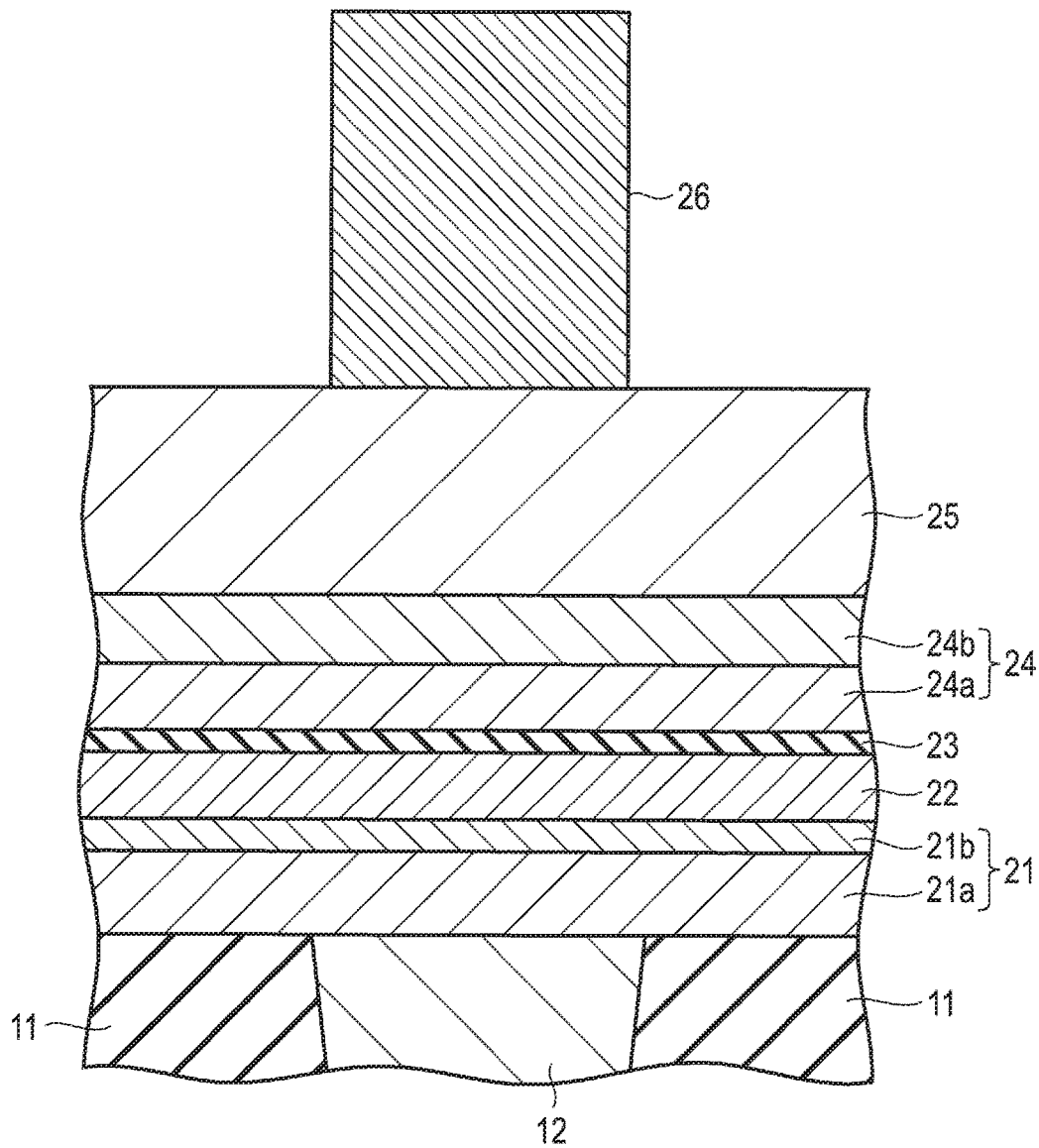
FIG. 3 is a cross-sectional view which schematically shows a part of a manufacturing method of the magnetic memory device according to the present embodiment.
Figure 4:
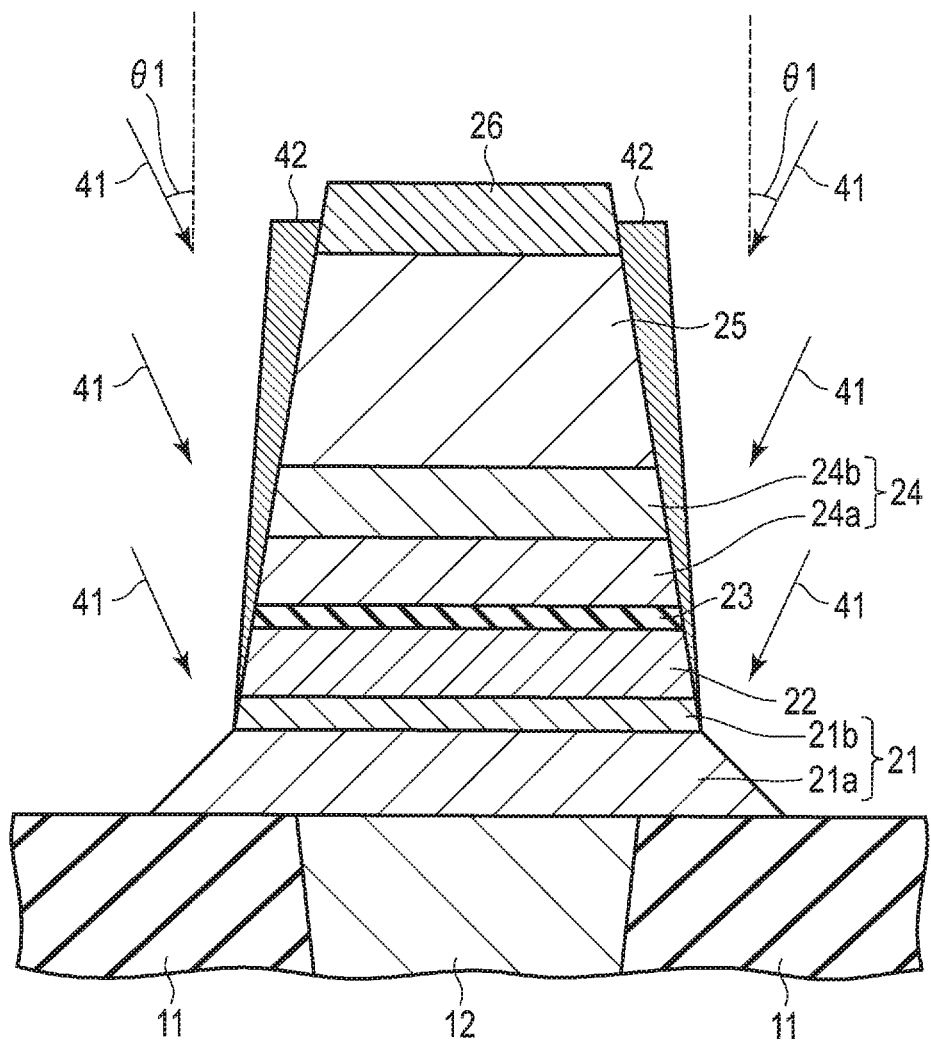
FIG. 4 is a cross-sectional view which schematically shows a part of the manufacturing method of the magnetic memory device according to the present embodiment.
Figure 5:
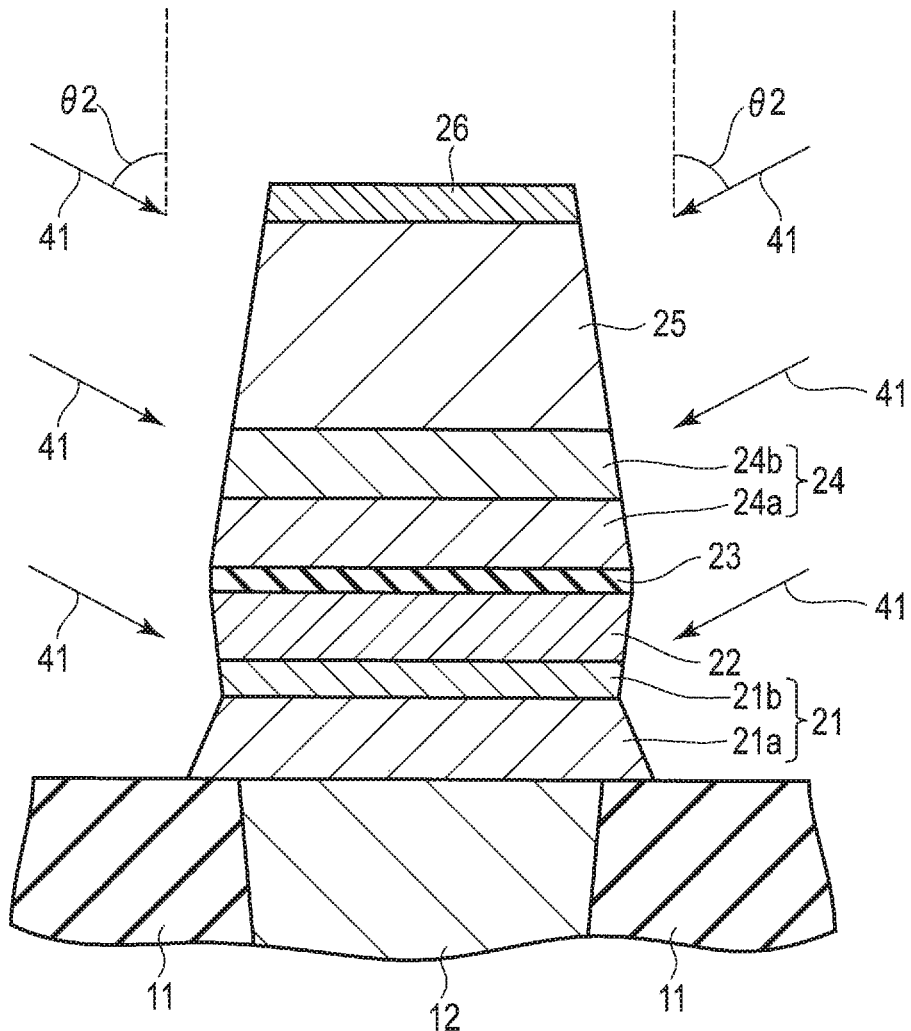
FIG. 5 is a cross-sectional view which schematically shows a part of the manufacturing method of the magnetic memory device according to the present embodiment.

FIGS. 3 to 5 are cross-sectional views which schematically show a method of manufacturing the magnetic memory device (the semiconductor integrated circuit device) according to the present embodiment.

First, as shown in FIG. 3, the interlayer insulating film 11 and the bottom electrode 12 are formed on the bottom structure including the semiconductor substrate (not shown), the MOS transistor (not shown), and the like. Next, on the structure including the interlayer insulating film 11 and the bottom electrode 12, a stacked film for the magnetoresistive element is formed. More specifically, a stacked film including the lower conductive layer 21 (the buffer layer 21a and the under layer 21b), the storage layer 22, the tunnel barrier layer 23, the reference layer 24 (the lower layer 24a and the upper layer 24b), and the shift canceling layer 25 is formed. Further, the upper conductive layer 26 is formed on the shift canceling layer 25, the upper conductive layer 26 is patterned, and a hard mask pattern is formed.

Next, as shown in FIG. 4, the stacked film formed in a process shown in FIG. 3 is patterned. That is, by using the hard mask pattern 26 as a mask, the stacked film is patterned by ion beam etching (IBE). More specifically, while rotating the substrate on which the stacked film is formed, an ion beam 41 is irradiated onto the stacked film obliquely. In this way, the stacked film is etched, and a stacked structure of a forward taper shape whose cross-sectional size is reduced from the lower surface of the stacked structure toward the upper surface of the same is obtained. Also, by setting an angle of incidence θ1 of the ion beam 41 to be small, a material of the stacked film which has been etched is redeposited on a side surface of the stacked structure, and a re-deposition layer 42 is formed. By adjusting the angle of incidence θ1 of the ion beam 41, the thickness of the re-deposition layer 42 can be controlled. Note that since IBE is physical etching, the hard mask pattern 26 is also etched, and the thickness of the hard mask pattern 26 is reduced.

Next, as shown in FIG. 5, IBE is performed by changing the angle of the ion beam. More specifically, similarly to the process shown in FIG. 4, by using the hard mask pattern 26 as a mask and rotating the substrate, the ion beam 41 is irradiated onto the stacked film obliquely. An angle of incidence θ2 of the ion beam 41 at this time is greater than the angle of incidence θ1 of the ion beam 41 in the process of FIG. 4. By setting the angle of incidence θ2 of the ion beam 41 to be large, as described above, etching of the stacked film proceeds while the re-deposition layer 42 formed through the process of FIG. 4 is being removed. The re-deposition layer 42 formed through the process of FIG. 4 is gradually thickened from the lower layer side toward the upper layer side. Accordingly, on the upper layer side of the stacked film, the re-deposition layer 42 is mainly etched, and an amount of the stacked film being etched is small. Meanwhile, on the lower layer side of the stacked film, an amount of the stacked film being etched is increased. As a result, as shown in FIG. 5, a forward tapered side surface is obtained on the upper layer side of the stacked film, and a reverse tapered side surface is obtained on the lower layer side of the stacked film. Therefore, by adjusting the angle of incidence θ2 of the ion beam 41, a stacked structure in which the storage layer 22 has a reverse tapered shape, and the reference layer 24 and the shift canceling layer 25 each have a forward tapered shape can be formed.

Next, as shown in FIG. 1, the protective insulating film 31 covering the stacked structure 20 is formed, and the interlayer insulating film 32 covering the protective insulating film 31 is formed. Further, by forming a hole in the protective insulating film 31 and the interlayer insulating film 32, and forming the top electrode 33 in the hole, a structure as shown in FIG. 1 can be obtained.

As described above, according to the manufacturing method of the present embodiment, by etching the stacked film by utilizing the re-deposition layer 42, the stacked structure 20 in which the storage layer 22 has a reverse tapered shape, and the reference layer 24 and the shift canceling layer 25 each have a forward tapered shape can be effectively formed.

Figure 7:
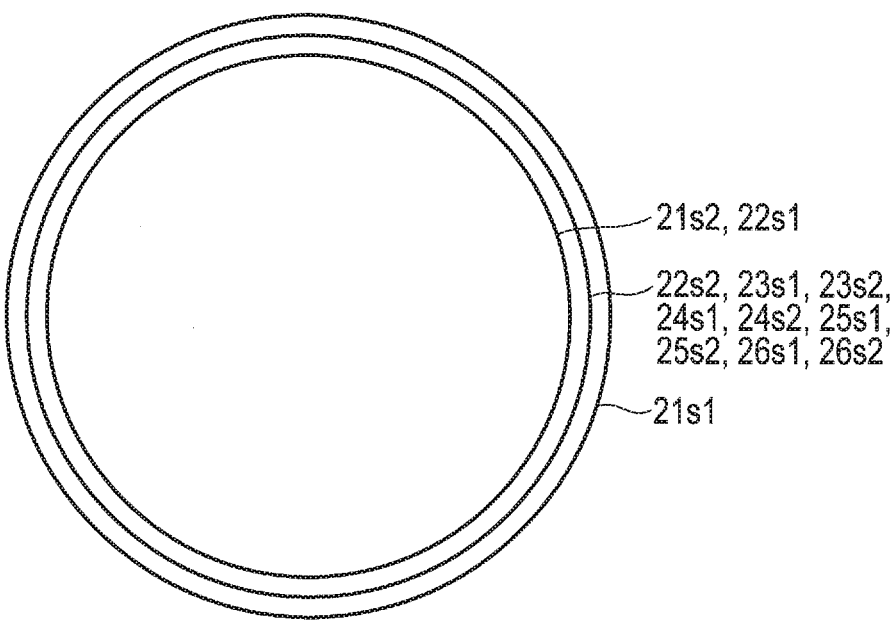
FIG. 7 is a plan view which schematically shows the structure of a stacked structure shown in FIG. 6.
Figure 6:
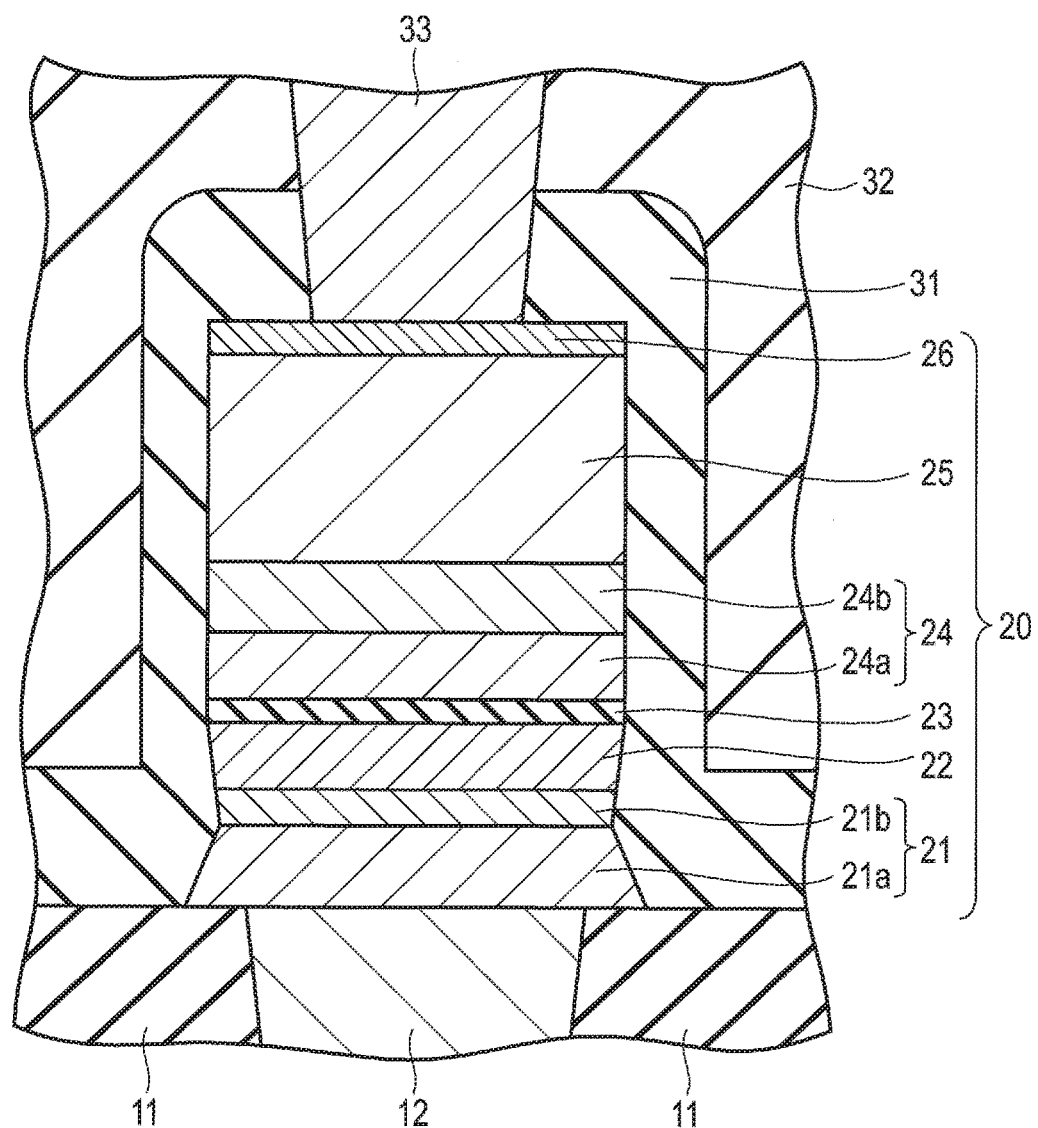
FIG. 6 is a cross-sectional view which schematically shows the structure of a modification of the magnetic memory device according to the present embodiment.

FIG. 6 is a cross-sectional view which schematically shows the structure of a modification of the magnetic memory device (the semiconductor integrated circuit device) according to the present embodiment. FIG. 7 is a plan view which schematically shows the structure of the stacked structure 20 shown in FIG. 6. Since the basic structure of this modification is the same as that of the above-described embodiment, explanation of the matters already described will not be repeated.

Also in this modification, likewise the embodiment described above, as viewed in the direction parallel to the direction in which the layers are stacked of the stacked structure 20, a pattern of the lower surface 22s1 of the storage layer (the first magnetic layer) 22 is located inside a pattern of the upper surface 22s2 of the storage layer (the first magnetic layer) 22. More specifically, likewise the embodiment described above, also in the present modification, a side surface of the storage layer 22 is inclined (i.e., tapered). An angle formed between the side surface of the storage layer 22 and the lower surface 22s1 of the storage layer 22 is greater than 90 degrees, and an angle formed between the side surface of the storage layer 22 and the upper surface 22s2 of the storage layer is smaller than 90 degrees.

Unlike the above-described embodiment, in the present modification, as viewed in the direction parallel to the direction in which the layers are stacked of the stacked structure 20, a pattern of the upper surface 24s2 of the reference layer (the second magnetic layer) 24 substantially conforms to a pattern of the lower surface 24s1 of the reference layer (the second magnetic layer) 24. More specifically, in the present modification, a side surface of the reference layer 24 is substantially perpendicular, thus, an angle formed between the side surface of the reference layer 24 and the lower surface 24s1 of the reference layer 24 is 90 degrees, and an angle formed between the side surface of the reference layer 24 and the upper surface 24s2 of the reference layer 24 is 90 degrees.

Further, in the present modification, as viewed in the direction parallel to the direction in which the layers are stacked of the stacked structure 20, a pattern of the upper surface 25s2 of the shift canceling layer (the third magnetic layer) 25 substantially conforms to a pattern of the lower surface 25s1 of the shift canceling layer (the third magnetic layer) 25. More specifically, in the present modification, a side surface of the shift canceling layer 25 is substantially perpendicular, thus, an angle formed between the side surface of the shift canceling layer 25 and the lower surface 25s1 of the shift canceling layer 25 is 90 degrees, and an angle formed between the side surface of the shift canceling layer 25 and the upper surface 25s2 of the shift canceling layer 25 is 90 degrees.

Further, in the present modification, as viewed in the direction parallel to the direction in which the layers are stacked of the stacked structure 20, a pattern of the upper surface 26s2 of the upper conductive layer 26 substantially conforms to a pattern of the lower surface 26s1 of the upper conductive layer 26. More specifically, in the present modification, a side surface of the upper conductive layer 26 is substantially perpendicular, thus, an angle formed between the side surface of the upper conductive layer 26 and the lower surface 26s1 of the upper conductive layer 26 is 90 degrees, and an angle formed between the side surface of the upper conductive layer 26 and the upper surface 26s2 of the upper conductive layer 26 is 90 degrees.

Also in this modification, likewise the embodiment described above, as viewed in the direction parallel to the direction in which the layers are stacked of the stacked structure 20, a pattern of an upper surface of the buffer layer 21a of the lower conductive layer 21 is located inside a pattern of a lower surface of the buffer layer 21a, and a pattern of a lower surface of the under layer 21b of the lower conductive layer 21 is located inside a pattern of an upper surface of the under layer 21b. More specifically, a side surface of the buffer layer 21a is inclined (i.e., tapered). An angle formed between the side surface of the buffer layer 21a and the lower surface of the buffer layer 21a is smaller than 90 degrees, and an angle formed between the side surface of the buffer layer 21a and the upper surface of the buffer layer 21a is greater than 90 degrees. In addition, a side surface of the under layer 21b is inclined (i.e., tapered). An angle formed between the side surface of the under layer 21b and the lower surface of the under layer 21b is greater than 90 degrees, and an angle formed between the side surface of the under layer 21b and the upper surface of the under layer 21b is smaller than 90 degrees.

As described above, in the present modification, the side surface of the reference layer 24, the side surface of the shift canceling layer 25, and the side surface of the upper conductive layer 26 are perpendicular. Accordingly, as viewed in the direction parallel to the direction in which the layers are stacked of the stacked structure 20, the pattern of the upper surface 22s2 of the storage layer 22, a pattern of the lower surface 23s1 of the tunnel barrier layer 23, a pattern of the upper surface 23s2 of the tunnel barrier layer 23, the pattern of the lower surface 24s1 of the reference layer 24, the pattern of the upper surface 24s2 of the reference layer 24, the pattern of the lower surface 25s1 of the shift canceling layer 25, the pattern of the upper surface 25s2 of the shift canceling layer 25, the pattern of the lower surface 26s1 of the upper conductive layer 26, and the pattern of the upper surface 26s2 of the upper conductive layer 26 substantially conform to each other.

As described above, also in this modification, likewise the above embodiment, the pattern of the lower surface 22s1 of the storage layer 22 is located inside the pattern of the upper surface 22s2 of the storage layer 22, as viewed in the direction parallel to the direction in which the layers are stacked of the stacked structure 20. Accordingly, of a stray magnetic field which is applied from the reference layer 24 to the storage layer 22, a stray magnetic field which remains at the end portion of the storage layer 22 as a result of insufficiency of shift cancellation can be suppressed. Accordingly, also in this modification, a magnetic memory device capable of suppressing a write error and having good write characteristics can be obtained, as in the embodiment described above.

Note that in the above-described embodiment and modification, the side surface of the storage layer 22 is tapered.

However, if the pattern of the lower surface 22s1 of the storage layer 22 is located inside the pattern of the upper surface 22s2 of the storage layer 22, as viewed in the direction parallel to the direction in which the layers are stacked of the stacked structure 20, the side surface of the storage layer 22 need not be tapered.

Figure 8:
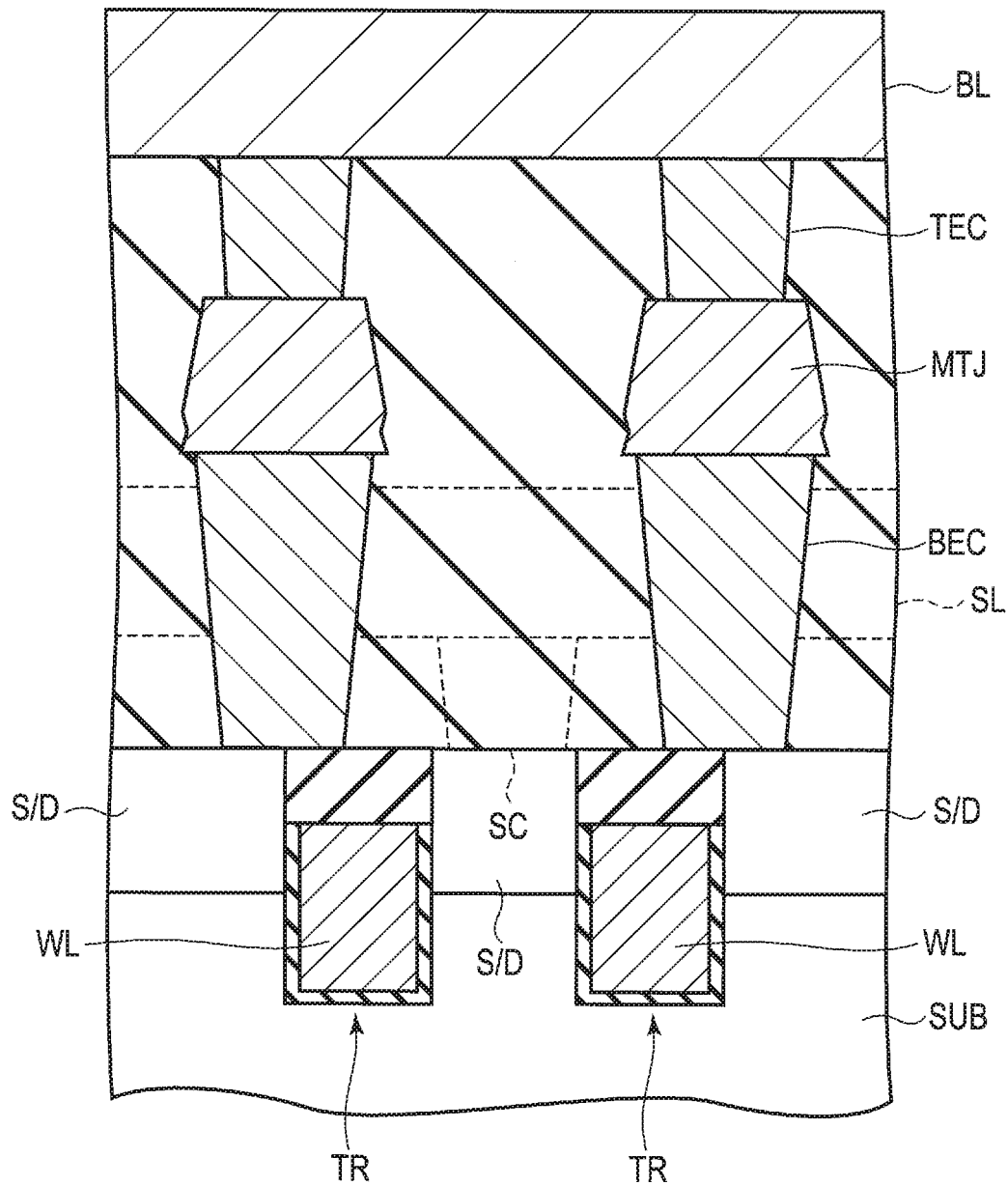
FIG. 8 is an illustration which schematically shows an example of a general structure of a semiconductor integrated circuit device to which a magnetoresistive element according to the present embodiment is applied.

FIG. 8 is an illustration which schematically shows an example of a general structure of a semiconductor integrated circuit device to which the magnetoresistive element according to the present embodiment is applied.

In a semiconductor substrate SUB, a buried gate MOS transistor TR is formed. A gate electrode of the MOS transistor TR is used as a word line WL. A bottom electrode BEC is connected to one of source/drain regions S/D of the MOS transistor TR, and a source line contact SC is connected to the other one of the source/drain regions S/D.

A magnetoresistive element MTJ is formed on the bottom electrode BEC, and a top electrode TEC is formed on the magnetoresistive element MTJ. A bit line BL is connected to the top electrode TEC. A source line SL is connected to the source line contact SC.

By applying the structure explained in the above embodiment to the semiconductor integrated circuit device shown in FIG. 8, an excellent semiconductor integrated circuit device can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure including a first magnetic layer having a variable magnetization direction, a nonmagnetic layer provided on the first magnetic layer, and a second magnetic layer provided on the nonmagnetic layer and having a fixed magnetization direction, wherein:
    as viewed in a direction parallel to a stack direction of the stacked structure, a pattern of a lower surface of the first magnetic layer is located inside a pattern of an upper surface of the first magnetic layer, a pattern of an upper surface of the second magnetic layer is located inside a pattern of a lower surface of the second magnetic layer, the pattern of the upper surface of the first magnetic layer substantially conforms to a pattern of a lower surface of the nonmagnetic layer, and the pattern of the lower surface of the second magnetic layer substantially conforms to a pattern of an upper surface of the nonmagnetic layer, and
    wherein an angle formed between a side surface of the first magnetic layer and the lower surface of the first magnetic layer is greater than 90 degrees, an angle formed between the side surface of the first magnetic layer and the upper surface of the first magnetic layer is smaller than 90 degrees, an angle formed between a side surface of the second magnetic layer and the lower surface of the second magnetic layer is smaller than 90 degrees, and an angle formed between the side surface of the second magnetic layer and the upper surface of the second magnetic layer is greater than 90 degrees.

2. The device of claim 1, wherein as viewed in the direction parallel to the stack direction of the stacked structure, the patterns of the lower surface and the upper surface of the first magnetic layer, the patterns of the lower surface and the upper surface of the nonmagnetic layer, and the patterns of the lower surface and the upper surface of the second magnetic layer are circular.

3. The device of claim 1, wherein a first resistance of the stacked structure when the magnetization direction of the first magnetic layer and the magnetization direction of the second magnetic layer are parallel to each other is lower than a second resistance of the stacked structure when the magnetization direction of the first magnetic layer and the magnetization direction of the second magnetic layer are antiparallel to each other.

4. The device of claim 1, wherein:
    the stacked structure further includes a third magnetic layer which is provided on the second magnetic layer, and has a fixed magnetization direction which is antiparallel to the magnetization direction of the second magnetic layer; and
    as viewed in the direction parallel to the stack direction of the stacked structure, a pattern of an upper surface of the third magnetic layer is located inside a pattern of a lower surface of the third magnetic layer or substantially conforms to the pattern of the lower surface of the third magnetic layer.

5. The device of claim 4, wherein an angle formed between a side surface of the third magnetic layer and the lower surface of the third magnetic layer is equal to 90 degrees or smaller than 90 degrees.

6. The device of claim 4, wherein an angle formed between a side surface of the third magnetic layer and the upper surface of the third magnetic layer is equal to 90 degrees or greater than 90 degrees.

7. The device of claim 4, wherein as viewed in the direction parallel to the stack direction of the stacked structure, the pattern of the upper surface of the second magnetic layer substantially conforms to the pattern of the lower surface of the third magnetic layer.

8. The device of claim 4, wherein as viewed in the direction parallel to the stack direction of the stacked structure, the patterns of the lower surface and the upper surface of the third magnetic layer are circular.

9. The device of claim 4, wherein:
    the stacked structure further includes an upper conductive layer provided on the third magnetic layer; and
    as viewed in the direction parallel to the stack direction of the stacked structure, a pattern of an upper surface of the upper conductive layer is located inside a pattern of a lower surface of the upper conductive layer, or substantially conforms to the pattern of the lower surface of the upper conductive layer.

10. The device of claim 9, wherein as viewed in the direction parallel to the stack direction of the stacked structure, the pattern of the upper surface of the third magnetic layer substantially conforms to the pattern of the lower surface of the upper conductive layer.

11. The device of claim 9, wherein the upper conductive layer is a hard mask layer.

12. The device of claim 1, wherein the stacked structure further includes a lower conductive layer on which the first magnetic layer is provided.

13. The device of claim 12, wherein an angle formed between a side surface of the lower conductive layer and a lower surface of the lower conductive layer is smaller than 90 degrees.

14. The device of claim 12, wherein an angle formed between a side surface of the lower conductive layer and an upper surface of the lower conductive layer is smaller than 90 degrees.

15. The device of claim 12, wherein as viewed in the direction parallel to the stack direction of the stacked structure, the pattern of the lower surface of the first magnetic layer substantially conforms to a pattern of an upper surface of the lower conductive layer.

16. The device of claim 1, wherein as viewed in the direction parallel to the stack direction of the stacked structure, the pattern of the upper surface of the first magnetic layer substantially conforms to the pattern of the lower surface of the second magnetic layer.

17. The device of claim 2, wherein a diameter of the pattern of the lower surface of the first magnetic layer is smaller than a diameter of the pattern of the lower surface of the second magnetic layer.

* * * * *